United States Patent
Abbott et al.

(10) Patent No.: US 6,849,806 B2
(45) Date of Patent: Feb. 1, 2005

(54) ELECTRICAL APPARATUS HAVING RESISTANCE TO ATMOSPHERIC EFFECTS AND METHOD OF MANUFACTURE THEREFOR

(75) Inventors: Donald C. Abbott, Norton, MA (US); Douglas W. Romm, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 52 days.

(21) Appl. No.: 09/993,189

(22) Filed: Nov. 16, 2001

(65) Prior Publication Data

US 2003/0094689 A1 May 22, 2003

(51) Int. Cl.[7] .................................................. H05K 1/16
(52) U.S. Cl. ....................... 174/260; 174/250; 174/256; 361/760; 257/788
(58) Field of Search ................................ 174/260, 524, 174/250, 256, 52.1, 52.2, 52.3; 361/760; 257/788, 778, 678, 701, 702, 729; 438/127; 428/411.1

(56) References Cited

U.S. PATENT DOCUMENTS

| | | | | | |
|---|---|---|---|---|---|
| 4,803,543 | A | * | 2/1989 | Inayoshi et al. | 257/783 |
| 4,821,148 | A | * | 4/1989 | Kobayashi et al. | 361/728 |
| 5,036,024 | A | * | 7/1991 | Mine et al. | 29/827 |
| 5,061,566 | A | * | 10/1991 | Morgan | 428/423.1 |
| 5,997,773 | A | * | 12/1999 | Angelopoulos et al. | 252/511 |
| 6,174,606 | B1 | * | 1/2001 | Brusic et al. | 428/413 |
| 6,225,681 | B1 | * | 5/2001 | Chungpaiboonpatana et al. | 257/642 |
| 6,344,157 | B1 | * | 2/2002 | Cheng et al. | 252/512 |
| 6,407,461 | B1 | * | 6/2002 | Farquhar et al. | 257/787 |
| 6,628,526 | B1 | * | 9/2003 | Oshima et al. | 361/760 |

* cited by examiner

*Primary Examiner*—Kamand Cuneo
*Assistant Examiner*—J B Patel
(74) *Attorney, Agent, or Firm*—W. Daniel Swayze, Jr.; W. James Brady; Frederick J. Telecky, Jr.

(57) ABSTRACT

An electrical apparatus having resistance to atmospheric effects includes at least one electrical device and a packaging structure. The packaging structure substantially encloses the at least one electrical device. The packaging structure includes a corrosion-resisting agent.

10 Claims, 5 Drawing Sheets

ELECTRICAL APPARATUS HAVING RESISTANCE TO ATMOSPHERIC EFFECTS AND METHOD OF MANUFACTURE THEREFOR

BACKGROUND OF THE INVENTION

The present invention is directed to electrical apparatuses, and especially to electrical apparatuses that include at least one electrical device and are used in an environment that fosters corrosion or other undesirable atmospheric effects.

Electrical apparatuses such as integrated circuit packages or the like are often employed in an atmosphere that fosters corrosion of metal parts or corrosion in the vicinity of metal parts, such as electrical terminations that effect electrical connection with the apparatus. Corrosion has been known to cause electrical open circuits when it progresses sufficiently to interrupt an electrical path in an electrical termination. Corrosion has also been known to cause shorting between electrical terminations when it progresses sufficiently to establish a conductive bridge between terminations. In today's market with smaller more densely constructed packages, the likelihood of corrosion-caused shorting between termination structures is a significant problem.

Prior art attempts to reduce corrosion have included applying corrosion-inhibiting materials, such as benzotriazole (BTA), to circuitry after assembly. For example, BTA has been applied directly to electrical apparatuses such as integrated circuit (IC) components prior to carrying out soldering operations. Another corrosion reduction measure has provided for spraying BTA on assembled printed wiring board assemblies or products. Such additional steps contribute to complexity in manufacturing products by inserting additional steps into the manufacturing process.

It would be advantageous to provide for reducing corrosion without requiring additional manufacturing steps. This advantage is realized by the present invention in providing novel component parts for use in manufacturing an electrical apparatus or product. The component parts provided according to the present invention inherently include corrosion-resistant agents, thereby obviating any requirement for extra manufacturing or processing steps to apply such corrosion-resistant materials.

SUMMARY OF THE INVENTION

An electrical apparatus having resistance to atmospheric effects includes at least one electrical device and a packaging structure. The packaging structure substantially encloses the at least one electrical device. The packaging structure includes a corrosion-resisting agent.

A method for manufacturing an electrical apparatus having resistance to atmospheric effects includes the steps of: (a) in no particular order: (1) providing at least one electrical device; (2) providing a substrate; and (b) providing a packaging structure. The packaging structure is configured for cooperating with the substrate to substantially fixedly enclose the at least one electrical device. At least one of the substrate and the packaging structure includes a corrosion-resisting agent.

It is, therefore, an object of the present invention to provide an apparatus for reducing corrosion without requiring additional manufacturing steps.

It is a further object of the present invention to provide a method for manufacturing such an apparatus for reducing corrosion.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
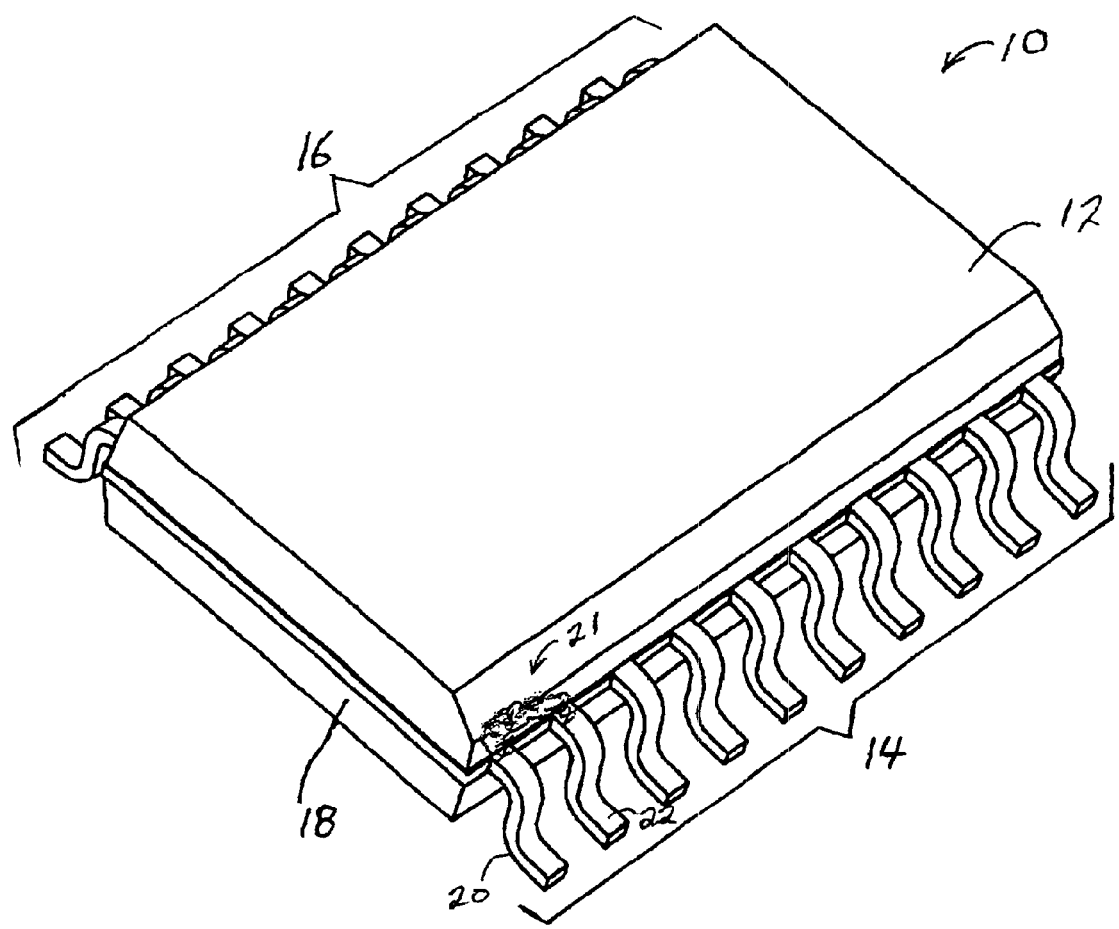
FIG. 1 is a perspective view of a first representative electrical apparatus with which the present invention may be employed.

FIG. 1 is a perspective view of a first representative electrical apparatus with which the present invention may be employed. In FIG. 1, an electrical apparatus 10 includes at least one electrical device (not visible in FIG. 1) within a package structure 12. Access structures in the form of electrical terminations or leads 14, 16 effect electrical contact with electrical devices within apparatus 10. A substrate 18 may be included to cooperate with package structure 12 to substantially fully enclose electrical devices within apparatus 10 while accommodating electrical termination structures 14, 16 for effecting connection with the interior devices. Substrate 18 may also fixedly mount electrical devices within apparatus 10. Alternately, package structure 12 may substantially fully enclose electrical devices within apparatus 10 without a cooperating substrate.

The problem addressed by the present invention is illustrated in FIG. 1 as an area of corrosion 21. Corrosion 21 may bridgingly connect leads 20, 22 as illustrated in FIG. 1 to establish a short circuit between leads 20, 21. Alternatively, corrosion 21 may completely corrode one or more of leads 20, 22 to cause a physical discontinuity and a consequent electrical open in one or more of leads 20, 22.

Figure 2:
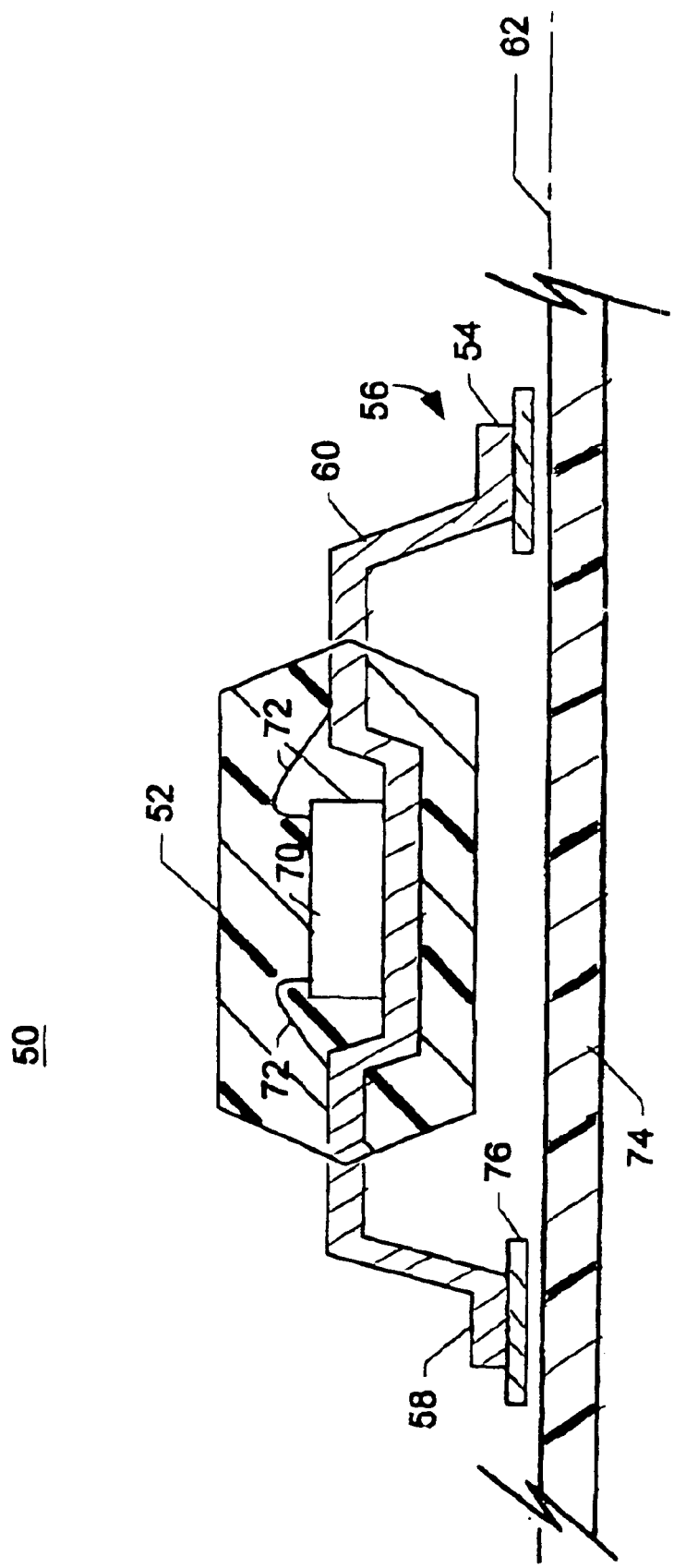
FIG. 2 is a schematic elevation view in partial section of the first representative electrical apparatus of FIG. 1 in an installed orientation.

FIG. 2 is a schematic elevation view in partial section of the first representative electrical apparatus of FIG. 1 in an installed orientation. In FIG. 2, an electrical apparatus or package 50 is assembled with a circuit board arrangement. An electrical device 70 is contained within package body 52. Package body 52 is a substantially solid molded body containing electrical device 70 from which contact structures 54 extend. Each contact structure 54 includes a transition area 56 from a lower portion 58 to an upper portion 60. Respective contact structures 54 are electrically coupled with electrical device 70 by bonding wires 72. Although not shown in detail in FIG. 2, those skilled in the relevant art will recognize that respective contact structures 54 are electrically discrete within body 52 in order to provide selective electrical connection with electrical device 70 via bonding wires 72.

Package 50 is mounted with a circuit board 74 for inclusion within an electrical product by affixing contact structures 54 with bonding loci, or pads, 76. Affixing may be effected using solder, conductive adhesive, or another affixing technology appropriate to establish an electrically conductive bond between a respective contact structure 54 and a respective bonding pad 76. By this structure, package 50 rests upon circuit board 74 substantially on seating plane 62 when assembled with circuit board 74. Bonding pads 76 are selectively coupled with circuit traces or other circuit elements in or on circuit board 74 (not shown in FIG. 2) in a manner known in the art to include electrical device 70 within circuitry on or within circuit board 74.

In electrical apparatuses 50 configured according to the teachings of the present invention, the material of at least one component of the electrical apparatus is constructed or manufactured to integrally include a corrosion-resisting agent or material, such as benzotriazole (BTA). For example, in electrical apparatus or package 50 (FIG. 2), body 52 includes a corrosion-resistant agent or material such as BTA. The corrosion-resisting agent may be mixed in as in a slurry arrangement or by another mixing process during manufacture of the material. If body 52 is a chemical compound material in which the resulting material is a composition of materials that are chemically combined at a molecular level, then the corrosion-resisting agent may be chemically combined within the compound material at a molecular level or mixed in.

An alternate embodiment of the present invention provides that circuit board 74 may integrally include a corrosion-resistant agent such as BTA, either in a compound or in a mixture as a mixed-in material, or combined at a molecular level in a chemical compound material.

Inclusion of the corrosion-resistant agent as a mixed-in material is preferred in any of the embodiments of the invention because there is thereby provided by a structural element inherent in the apparatus or product as source of corrosion-resistant material that may outgas, vent or otherwise exude over the apparatus or product to facilitate resisting corrosion. The concentration in which the corrosion-resistant material is included according to the invention may be chosen according to many factors such as, duration for which corrosion protection is desired, anticipated concentration of corrosive atmosphere expected to be endured by the apparatus or product and other similar factors.

Inclusion of corrosion-resistant material as an integral component of a compound combined in the material at a molecular level requires that the material break down in some manner in order to release the corrosion-resistant material. It is for this reason that the mixed-in embodiment of including corrosion-resistant material is the preferred embodiment of the invention.

Figure 3:
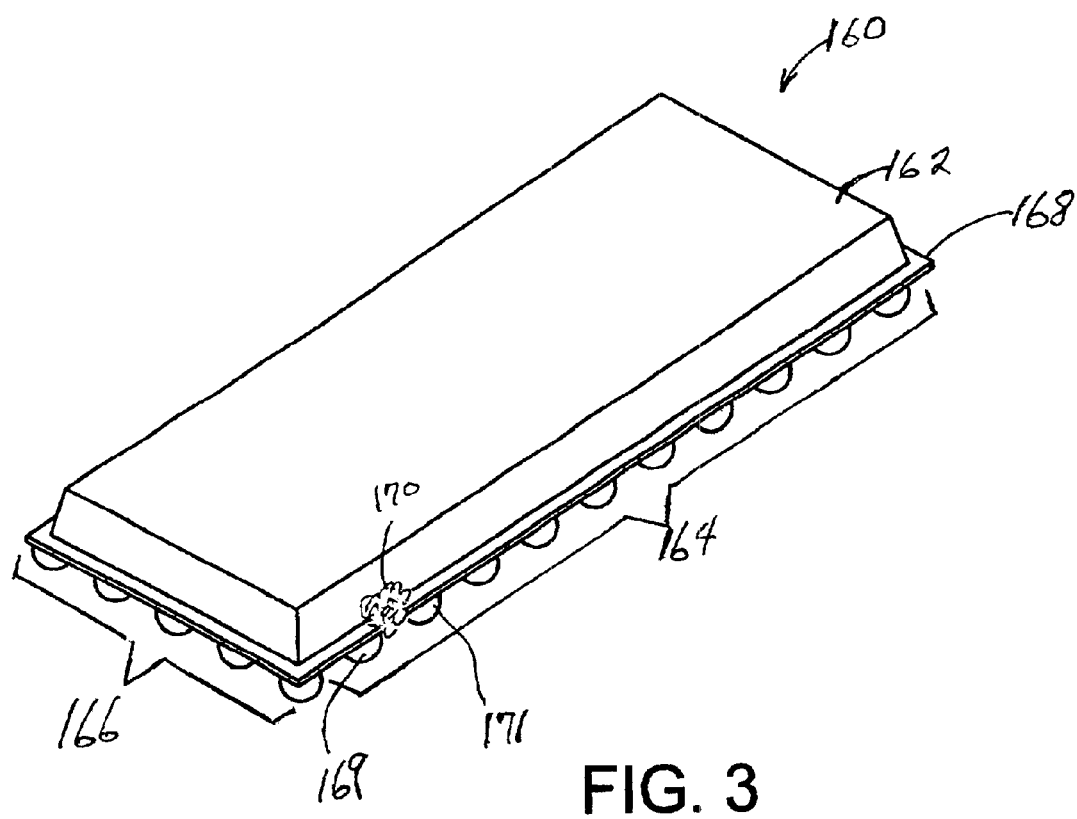
FIG. 3 is a perspective view of a second representative electrical apparatus with which the present invention may be employed.

FIG. 3 is a perspective view of a second representative electrical apparatus with which the present invention may be employed. In FIG. 3, an electrical apparatus 160 includes at least one electrical device (not visible in FIG. 3) within a package structure 162. Access structures in the form of arrays of solder ball terminations or contacts 164, 166 effect electrical contact with electrical devices within apparatus 160. A substrate 168 cooperates with package structure 162 to substantially fully enclose electrical devices within apparatus 160 while accommodating solder ball termination structures 164, 166 for effecting connection with the interior devices. Substrate 168 may also fixedly mount electrical devices within apparatus 160.

The problem addressed by the present invention is illustrated in FIG. 3 as an area of corrosion 170. Corrosion 170 may bridgingly connect solder ball terminal structures 169, 171 as illustrated in FIG. 3 to establish a short circuit between solder ball terminal structures 169, 171. While possible, the likelihood that corrosion 170 may completely corrode one or more of solder ball terminal structures 169, 171 to cause a physical discontinuity and a consequent electrical open is less likely than with the structure of electrical apparatus 10 (FIG. 1). This is so because there is a greater mass of material that must be breached to cause an electrical open with a ball structure (FIG. 3) than needs to be breached with a flat contact structure (FIG. 1).

Figure 4:
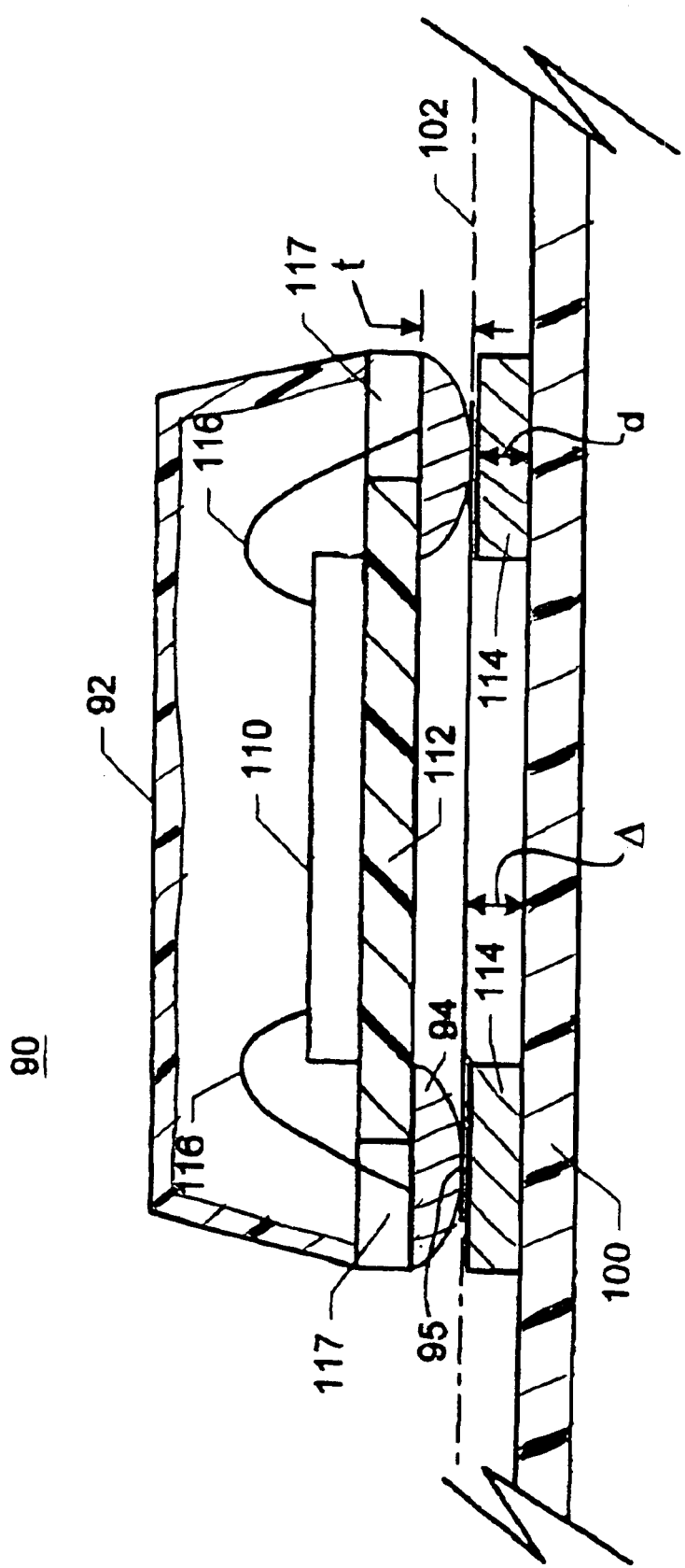
FIG. 4 is a schematic elevation view in partial section of the second representative electrical apparatus of FIG. 3 in an installed orientation.

FIG. 4 is a schematic elevation view in partial section of the second representative electrical apparatus of FIG. 3 in an installed orientation. In FIG. 4, an electrical apparatus or package 90 includes a package body 92 containing an electrical device 110. Electrical device 110 rests upon a substrate 112. Solder ball terminal or contact structures 94 present electrical access for selectively coupling electrical device 110 with respective contact structures 94 within body 92 using bonding wires 116 via apertures 117 in substrate 112, and also present electrical access for coupling contact structures 94 with circuitry on or within a circuit board 100 via mounting structures 114. Package 90 may be mounted upon circuit board 100, for example, for effecting inclusion of package 90 within an electrical product. In the embodiment of contact structures 94 illustrated in FIG. 4, contact structures 94 are substantially oval deformed solder ball contact pads having an installed thickness t. Contact structures 94 present an electrically conductive land 95 that provides electrical coupling with electrical device 110 contained within package 90. When package 90 is assembled with circuitry on or within circuit board 100 conductive lands 95 of contact structures 94 and substrate 112 cooperate to establish a seating plane 102 upon which package 90 rests in an installed orientation. Conductive lands 95 may be coupled with mounting structures 114 using electrical connection structures employing surface mounting, conductive adhesive or other connection techniques known in circuit fabrication. The particular coupling technique employed for coupling conductive lands 95 with mounting structures 114 determines a separation or standoff distance Δ between substrate 112 and circuit board 100. Mounting structures 114 may be configured to extend a distance d above circuit board 100 to contribute to standoff distance Δ. Mounting structures 114 are selectively coupled with circuit traces or other circuit elements in or on circuit board 100 (not shown in FIG. 4) in a manner known in the art to include electrical device 110 within circuitry on or within circuit board 100.

Package body 92 is preferably a substantially solid molded body containing electrical device 110 (FIG. 2). Alternatively, package body 92 may be embodied in a shell structure that establishes a substantially enclosed atmosphere about electrical device 110, as illustrated in FIG. 4. Although not shown in detail in FIG. 4, those skilled in the relevant art will recognize that respective contact structures 94 are electrically discrete within body 92 in order to provide selective electrical connection with electrical device 110 via bonding wires 116.

In electrical apparatuses 90 configured according to the teachings of the present invention, the material of which at least one component of the electrical apparatus is constructed or manufactured integrally includes a corrosion-resisting agent or material, such as benzotriazole (BTA). For example, in electrical apparatus or package 90 (FIG. 4), body 92 or substrate 112 (or both body 92 and substrate 112) may include a corrosion-resistant agent or material such as BTA. If body 52 or substrate 112 is a chemical compound material in which the resulting material is a composition of materials that are chemically combined at a molecular level, then the corrosion-resisting agent may be mixed in as in a slurry arrangement during manufacture of the material. Alternatively, if body 52 or substrate 112 is a chemical compound material the corrosion-resisting agent may be chemically combined within the compound material at a molecular level.

Yet another alternate embodiment of the present invention provides that circuit board 100 may integrally include a corrosion-resistant agent such as BTA, either in a compound or in a mixture as a mixed-in material, or combined at a molecular level in a chemical compound material.

Figure 5:
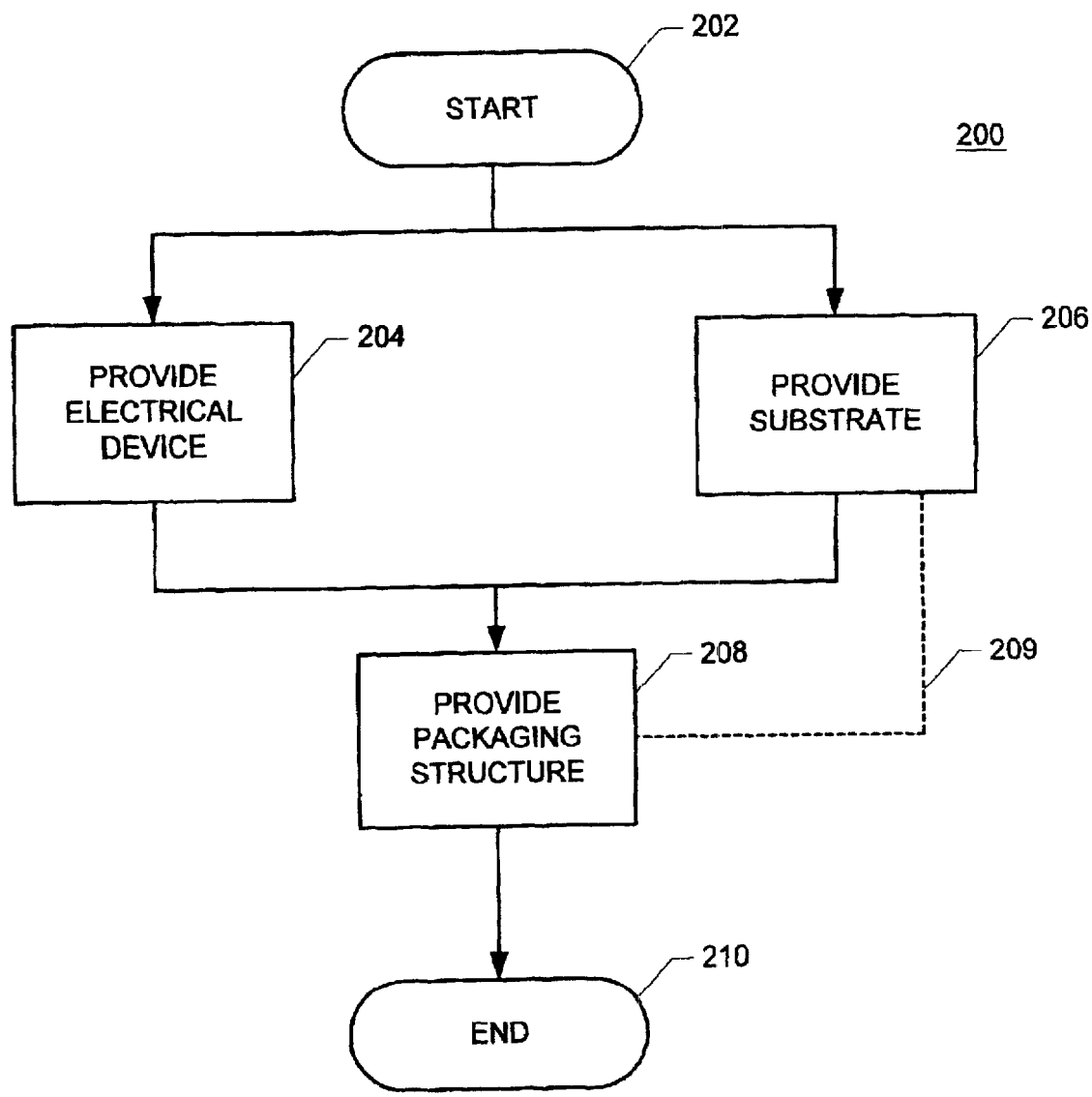
FIG. 5 is a flow diagram illustrating the method of the present invention.

FIG. 5 is a flow diagram illustrating the method of the present invention. In FIG. 5, a method 200 for manufacturing an electrical apparatus having resistance to atmospheric effects begins at a start locus 202. Method 200 proceeds from start locus 202 to, in no particular order: (1) provide at least one electrical device, as indicated b a block 204 and (2) provide a substrate, as indicated by a block 206. Method 200 continues by providing a packaging structure, as indicated by a block 208. The packaging structure provided during the step represented by block 208 is configured for cooperating (as indicated by dotted line 209) with the substrate provided during the step represented by block 206 to substantially fixedly enclose the at least one electrical device provided during the step represented by block 204. At least one of the substrate (block 206) and the packaging structure (block 208) includes a corrosion-resisting agent.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. An improved electrical apparatus and a substrate configured for resistance to atmospheric effects; the apparatus including at least one electrical device and a package structure, said package structure substantially enclosing said at least one electrical device; the improvement comprising: involving a corrosion-resisting agent of said package structure, wherein said electrical apparatus is affixed with said substrate included in an electrical product and wherein said substrate is embodied in a chemical compound material; said involving being effected by subsuming said corrosion-resisting agent as an element of said compound material.

2. The electrical apparatus of claim 1, wherein said electrically insulating component is a package body that contains said electrical device.

3. An improved electrical apparatus and a substrate configured for resistance to atmospheric effects; the apparatus including at least one electrical device and a package structure, said package structure substantially enclosing said at least one electrical device: the improvement comprising: involving a corrosion-resisting agent with of said package structure, wherein said electrical apparatus is affixed with said substrate included in an electrical product and wherein said substrate is embodied in a chemical mixture material; said involving being effected by subsuming said corrosion-resisting agent as a component of said mixture material.

4. An improved electrical apparatus configured for resistance to atmospheric corrosive effects as recited in claim 3 wherein said package structure effects said substantially enclosing said at least one electrical device to establish an enclosed volume substantially bounded by said package structure; said at least one electrical device being substantially contained within said enclosed volume.

5. An improved electrical apparatus configured for resistance to atmospheric corrosive effects as recited in claim 3 wherein said packaging structure is a substantially solid structure and wherein said at least one electrical device is substantially embedded within said solid structure.

6. An electrical apparatus and a substrate having resistance to atmospheric effects; the apparatus comprising at least one electrical device and a packaging structure; said packaging structure substantially enclosing said at least one electrical device; said electrically insulating component of said packaging structure including a corrosion-resisting agent, wherein said electrical apparatus is affixed with said substrate included in an electrical product and wherein said substrate is embodied in a chemical compound material; said including being effected by subsuming said corrosion-resisting agent as an element of said compound material.

7. The electrical apparatus of claim 6, wherein said electrically insulating component is a package body that contains said electrical device.

8. An electrical apparatus and a substrate having resistance to atmospheric effects; the apparatus comprising at least one electrical device and a packaging structure; said packaging structure substantially enclosing said at least one electrical device; said packaging structure including a corrosion-resisting agent, wherein said electrical apparatus is affixed with said substrate included in an electrical product and wherein said substrate is embodied in a chemical mixture material; said including being effected by subsuming said corrosion-resisting agent as a component of said mixture material.

9. An improved electrical apparatus configured for resistance to atmospheric effects; the apparatus including at least one electrical device and a package structure comprising an electrically insulating component, said package structure substantially enclosing said at least one electrical device; the improvement comprising: involving a corrosion-resisting agent with said electrically insulating component of said package structure, wherein said electrically insulating component is a substrate upon which said electrical device is supported.

10. An electrical apparatus having resistance to atmospheric effects; the apparatus comprising at least one electrical device and a packaging structure comprising an electrically insulating component; said packaging structure substantially enclosing said at least one electrical device; said electrically insulating component of said packaging structure including a corrosion-resisting agent, wherein said electrically insulating component is a substrate upon which said electrical device is supported.

* * * * *